United States Patent
Kaneko et al.

(10) Patent No.: US 12,131,960 B2
(45) Date of Patent: Oct. 29, 2024

(54) TEMPERATURE DISTRIBUTION EVALUATION METHOD, TEMPERATURE DISTRIBUTION EVALUATION DEVICE, AND SOAKING RANGE EVALUATION METHOD

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Daichi Dojima, Hyogo (JP); Koji Ashida, Hyogo (JP); Tomoya Ihara, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 504 days.

(21) Appl. No.: 17/606,743

(22) PCT Filed: Apr. 24, 2020

(86) PCT No.: PCT/JP2020/017644
§ 371 (c)(1),
(2) Date: Oct. 26, 2021

(87) PCT Pub. No.: WO2020/218484
PCT Pub. Date: Oct. 29, 2020

(65) Prior Publication Data
US 2022/0216116 A1  Jul. 7, 2022

(30) Foreign Application Priority Data

Apr. 26, 2019 (JP) ................... 2019-086715

(51) Int. Cl.
*G01B 21/08* (2006.01)
*G01K 1/02* (2021.01)
(Continued)

(52) U.S. Cl.
CPC .............. *H01L 22/12* (2013.01); *G01B 21/08* (2013.01); *G01K 1/026* (2013.01); *H01L 21/67248* (2013.01); *H01L 21/67253* (2013.01)

(58) Field of Classification Search
None
See application file for complete search history.

(56) References Cited

U.S. PATENT DOCUMENTS

2004/0047394 A1    3/2004  Shibata et al.
2004/0051854 A1*   3/2004  Tanaka ................ G03F 7/70766
                                                       355/53
(Continued)

FOREIGN PATENT DOCUMENTS

JP    2002203850 A    7/2002
JP    2002261140 A    9/2002
(Continued)

OTHER PUBLICATIONS

Extended Search Report from European Application No. 20796042.8 dated Dec. 20, 2022 (8 pages).
(Continued)

*Primary Examiner* — Erica S Lin
(74) *Attorney, Agent, or Firm* — Calfee, Halter & Griswold LLP (57) ABSTRACT

To provide a new temperature distribution evaluation method, a temperature distribution evaluation device, and a soaking range evaluation method, as the temperature distribution evaluation method which evaluates a temperature distribution of a heating area 40A provided in a heating device 40, the present invention is a temperature distribution evaluation method which, in the heating area 40A, heats a semiconductor substrate 10 and a transmitting and receiving body 20 for transporting a raw material to and from the semiconductor substrate 10, and evaluates a temperature (Continued)

distribution of the heating area 40A on the basis of a substrate thickness variation amount A of the semiconductor substrate 10. Accordingly, temperature distribution evaluation can be implemented for a high temperature area at 1600-2200° C. or the like at which it is hard to evaluate the temperature distribution due to the limit of a thermocouple material.

23 Claims, 9 Drawing Sheets (51) Int. Cl.
  *H01L 21/66* (2006.01)
  *H01L 21/67* (2006.01)

(56) References Cited

U.S. PATENT DOCUMENTS

2006/0240287 A1* 10/2006 Kumagai .............. C04B 41/009
                                                           427/372.2
2010/0240224 A1* 9/2010 Wu ..................... F27B 17/0025
                                                           219/390
2017/0345672 A1 11/2017 Kaneko et al.
2020/0101490 A1* 4/2020 Nozawa ............... C23C 16/4557
2022/0074048 A1* 3/2022 Preti ..................... C30B 23/063

FOREIGN PATENT DOCUMENTS

| | | |
|---|---|---|
| JP | 2008066643 A | 3/2008 |
| JP | 2009111295 A | 5/2009 |
| JP | 2016008821 A | 1/2016 |
| TW | 201629281 A | 8/2016 |

OTHER PUBLICATIONS

International Search Report of PCT/JP2020/017644 dated Jul. 7, 2020 (2 pages).

* cited by examiner

TEMPERATURE DISTRIBUTION EVALUATION METHOD, TEMPERATURE DISTRIBUTION EVALUATION DEVICE, AND SOAKING RANGE EVALUATION METHOD

CROSS-REFERENCE TO RELATED APPLICATIONS

This application is a 371 of PCT Application No. PCT/JP2020/017644, filed on Apr. 24, 2020, which claims priority to Japanese Application No. 2019-086715, filed on Apr. 26, 2019, the contents of which are hereby incorporated by reference as if recited in their entirety.

TECHNICAL FIELD

The present invention relates to a temperature distribution evaluation method, a temperature distribution evaluation device, and a soaking range evaluation method.

BACKGROUND ART

The improvement in manufacturing yield of semiconductor device is realized by temperature management in a heating environment in a semiconductor process. The temperature management is important, for example, in a crystal growth process, an impurity introduction process, an annealing process, an etching process, and the like.

For example, an silicon carbide (SiC) material is regarded as promising as a suitable power device material having higher dielectric breakdown field strength and thermal conductivity than an silicon (Si) material or the like. However, the SiC material is required to be heated in a higher temperature range than the Si material or the like due to its thermal stability. Not only the SiC material but also a semiconductor material having a higher melting point than the Si material may have difficulty in temperature management as compared with the conventional Si semiconductor process.

Patent Literature 1 describes providing a heating furnace temperature evaluation jig capable of measuring a temperature of 1600° C. to 1800° C. by forming a recess in an SiC substrate, disposing a thermocouple in the recess, and fixing the thermocouple using a filling member having a heat-resistant adhesive member.

CITATION LIST

Patent Literature

Patent Literature 1: JP 2016-8821 A

SUMMARY OF INVENTION

Technical Problem

When using the heating furnace temperature evaluation jig described in Patent Literature 1, it was necessary to wire a thermocouple strand from outside a heating region. Therefore, there is a problem that it is difficult to evaluate the temperature distribution in the heating region because the temperature escapes from the wiring location. In addition, it was difficult to evaluate the temperature distribution in a high temperature range such as 1600 to 2200° C. due to the material limit of the thermocouple An object of the present invention is to provide a novel temperature distribution evaluation method, temperature distribution evaluation device, and soaking range evaluation method.

Solution to Problem

In order to solve the above problems, according to the present invention, a temperature distribution evaluation method for evaluating a temperature distribution in a heating region included in a heating device includes heating a semiconductor substrate and a release and reception body, which transports a raw material to the semiconductor substrate, in the heating region; and evaluating the temperature distribution in the heating region based on a substrate thickness change amount of the semiconductor substrate.

As described above, by evaluating the temperature distribution in the heating region based on the substrate thickness change amount of the semiconductor substrate, it is possible to perform the temperature distribution evaluation in the temperature region higher than the thermocouple without wiring.

In a preferred embodiment of the present invention, the semiconductor substrate and the release and reception body are disposed so as to face each other, and are heated so that a temperature gradient is formed between the semiconductor substrate and the release and reception body.

In addition, in a preferred embodiment of the present invention, the substrate thickness change amount is an amount obtained by changing the temperature gradient formed in the heating region as a driving force.

As described above, by using the temperature gradient as the driving force of the substrate thickness change amount, it is possible to accurately evaluate the temperature distribution in the heating region.

In a preferred embodiment of the present invention, the temperature distribution evaluation method includes: a measurement point setting process of setting a plurality of measurement points in the heating region; a substrate disposition process of disposing the semiconductor substrate and the release and reception body at positions corresponding to the measurement points; a change amount measurement process of measuring the substrate thickness change amounts of the semiconductor substrates corresponding to the measurement points; and a change amount comparison process of comparing the plurality of substrate thickness change amounts.

In a preferred embodiment of the present invention, in the measurement point setting process, the plurality of measurement points are set in the horizontal direction of the heating region.

By setting the measurement point in such a direction, it is possible to measure the temperature distribution in a horizontal direction of the heating region.

In a preferred embodiment of the present invention, in the measurement point setting process, the plurality of measurement points are set in a height direction of the heating region.

By setting the measurement point in such a direction, it is possible to measure the temperature distribution in the height direction of the heating region.

In a preferred embodiment of the present invention, in the substrate disposition process, the plurality of semiconductor substrates is disposed along the measurement point.

In this way, by arranging the plurality of semiconductor substrates along the measurement point, the semiconductor substrate can be disposed at a position necessary for temperature distribution measurement. That is, it is not necessary to use the semiconductor substrate having an area covering the entire heating region.

In a preferred embodiment of the present invention, the substrate thickness change amount is an etching amount or a growth amount.

In this way, it is possible to evaluate the temperature distribution based on the etching amount and the growth amount. Therefore, the temperature distribution can be evaluated by appropriately selecting a change amount that is easy to measure.

In a preferred embodiment of the present invention, the semiconductor substrate and the release and reception body are selected from any one of SiC, GaN, and AlN materials.

By selecting the semiconductor substrate and the release and reception body made of such a material, it is possible to measure a temperature distribution in a temperature region that is difficult for a thermocouple. Further, by selecting an optimum semiconductor material according to a temperature region to be measured, it is possible to more accurately evaluate the temperature distribution.

The present invention also relates to a temperature distribution evaluation device including a temperature distribution evaluation unit that is disposed in a heating region included in a heating device, in which the temperature distribution evaluation unit includes a semiconductor substrate and a release and reception body that faces the semiconductor substrate and transports a raw material by heating the semiconductor substrate.

By using such a temperature distribution evaluation device, it is possible to perform the temperature distribution evaluation in the temperature region higher than the thermocouple without the wiring.

In a preferred embodiment of the present invention, the temperature distribution evaluation unit includes an installation tool that installs the semiconductor substrate and the release and reception body so as to face each other.

As described above, by including the installation tool that installs the semiconductor substrate and the release and reception body so as to face each other, it is possible to accurately adjust the distance between the semiconductor substrate and the release and reception body and the like.

In a preferred embodiment of the present invention, the temperature distribution evaluation units are provided in plurality.

In this way, by providing the plurality of temperature distribution evaluation units, it is not necessary to use the semiconductor substrate having the area that covers the entire heating region.

In a preferred embodiment of the present invention, the installation tool is provided with a first abutting surface on which the semiconductor substrate abuts and a second abutting surface on which the release and reception body abuts.

In this way, by having the abutting surface on which the semiconductor substrate and the release and reception body abut on each other, it is possible to form the quasi-closed space between the semiconductor substrate and the release and reception body, and more accurately perform the temperature distribution evaluation.

A preferred embodiment of the present invention, includes the positioning means that positions the semiconductor substrate and/or the release and reception body.

In this way, by providing the positioning means for the semiconductor substrate, it is possible to suppress unintended misalignment of the semiconductor substrate and the release and reception body.

In a preferred embodiment of the present invention, the positioning means is a frame portion provided along an edge of the semiconductor substrate and/or the release and reception body.

In this way, the positioning can be easily performed by providing the frame portion.

In a preferred embodiment of the present invention, the temperature distribution evaluation device further includes a storage container that stores the temperature distribution evaluation unit, in which the storage container forms, in the container, an atmosphere containing an element constituting the semiconductor substrate during heating.

In this way, by providing the storage container that stores the temperature distribution evaluation unit, it is possible to suppress the raw material from being exhausted from the quasi-closed space.

In a preferred embodiment of the present invention, the temperature distribution evaluation device further includes the storage container that stores the semiconductor substrate, in which a part of the storage container is constituted by the release and reception body.

In this way, by forming a part of the storage container as the release and reception body, it is possible to transmit and receive atoms to and from the semiconductor substrate while forming the quasi-closed space.

In a preferred embodiment of the present invention, the semiconductor substrate and the release and reception body are selected from any one of SiC, GaN, and AlN materials.

In addition, the present invention relates to a soaking range evaluation method. That is, a soaking range evaluation method according to one aspect of the present invention includes; heating, in a heating region of a heating device, a semiconductor substrate and a release and reception body that transports a raw material to the semiconductor substrate at a plurality of measurement points in the heating region; and evaluating a soaking range of the heating region based on a substrate thickness change amount of the semiconductor substrate.

In a preferred embodiment of the present invention, the semiconductor substrate and the release and reception body are disposed so as to face each other, and are heated so that a temperature gradient is formed between the semiconductor substrate and the release and reception body.

In a preferred embodiment of the present invention, the soaking range evaluation method includes a measurement point setting process of setting a plurality of measurement points in the heating region, and a substrate disposition process of disposing the semiconductor substrate and the release and reception body at positions corresponding to the measurement points; and a heating process of heating the semiconductor substrate and the release and reception body in the heating region to change a substrate thickness of the semiconductor substrate;

a change amount measurement process of measuring a substrate thickness change amount of the semiconductor substrate corresponding to the measurement point; and a change amount comparison process of comparing substrate thickness change amounts at the plurality of measurement points.

In a preferred embodiment of the present invention, a heating temperature of the semiconductor substrate and the release and reception body is 1600° C. or higher.

In a preferred embodiment of the present invention, the heating temperature of the semiconductor substrate and the release and reception body is 1800° C. or higher.

Advantageous Effects of Invention

According to the disclosed technology, it is possible to provide a novel temperature distribution evaluation method, temperature distribution evaluation device, and soaking range evaluation method.

Other problems, features and advantages will become apparent from a reading of the following detailed description when taken in conjunction with the drawings and claims.

DESCRIPTION OF EMBODIMENTS

Hereinafter, preferred embodiments of the present invention illustrated in the drawings will be described in detail with reference to the drawings.

The technical scope of the present invention is not limited to the embodiments illustrated in the accompanying drawings, and can be appropriately changed within the scope described in the claims.

<<Temperature Distribution Evaluation Method>>

The present invention relates to a temperature distribution evaluation method for evaluating the temperature distribution in a heating region 40A included in a heating device 40, in which the method includes a temperature distribution evaluation process S1 of heating a semiconductor substrate 10 and a release and reception body 20, which transports a raw material to the semiconductor substrate 10, in a heating region 40A, and evaluating the temperature distribution in the heating region 40A based on a substrate thickness change amount A of the semiconductor substrate 10.

Figure 1:
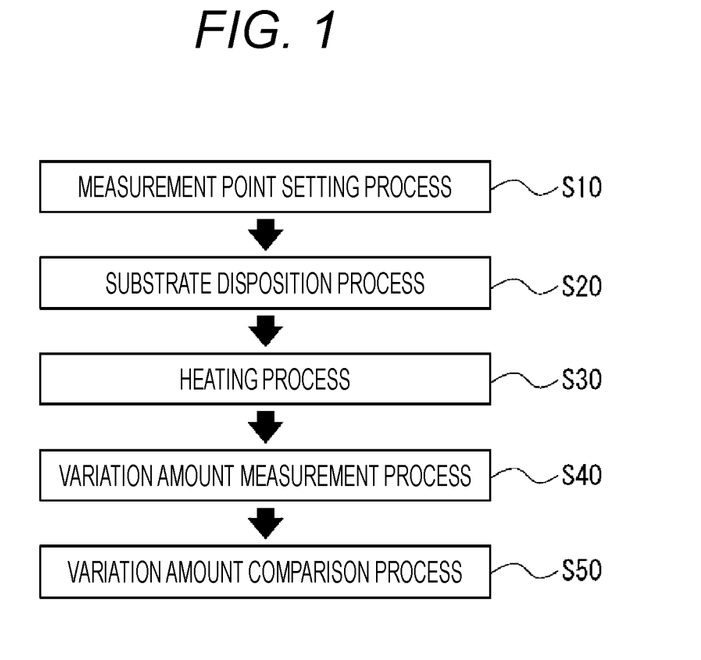
FIG. 1 is a schematic view illustrating a temperature distribution evaluation process of a temperature distribution evaluation method according to the present invention.

Specifically, as illustrated in FIG. 1, the temperature distribution evaluation process S1 includes: a measurement point setting process S10 of setting a plurality of measurement points P in the heating region 40A; a substrate disposition process S20 of disposing the semiconductor substrate 10 and the release and reception body 20 at positions corresponding to measurement points P; a heating process S30 of heating the semiconductor substrate 10 and the release and reception body 20 in the heating region 40A to change a substrate thickness T; a change amount measurement step S40 of measuring a substrate thickness change amounts A of the semiconductor substrate 10 corresponding to the measurement points P; and a change amount comparison process S50 of comparing the substrate thickness change amounts A at the plurality of measurement points P.

Hereinafter, details of the temperature distribution evaluation process S1 will be described in detail with reference to FIGS. 2 and 3.

<Measurement Point Setting Process S10>

The measurement point setting process S10 is a process of setting a plurality of measurement points P in the heating region 40A.

First, the heating device 40 to be measured for temperature distribution according to the present invention will be described.

Figure 2:
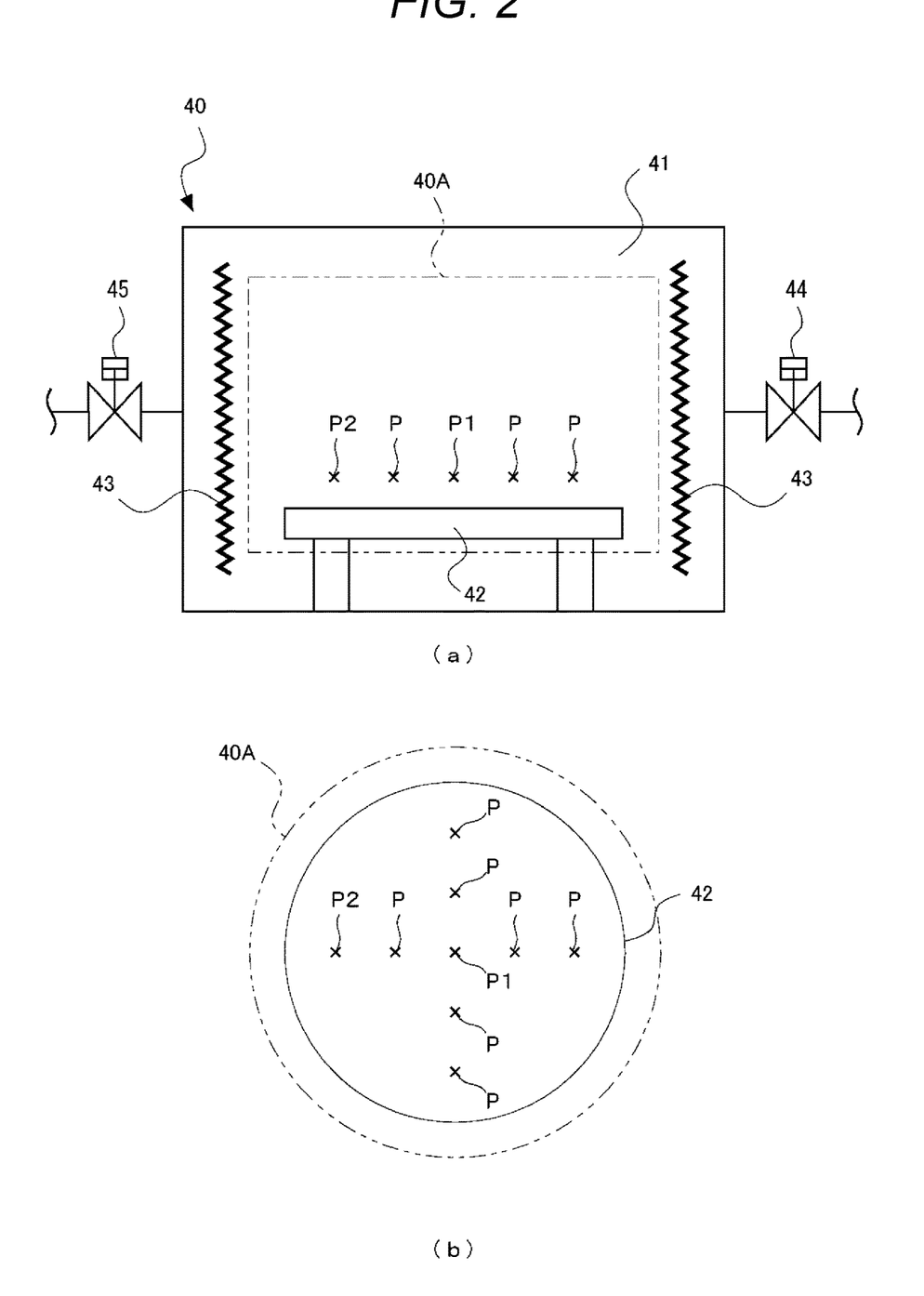
FIG. 2 is a schematic view illustrating a measurement point setting process of the temperature distribution evaluation method according to the present invention.

FIG. 2 is an example of the heating device 40 to be measured by the temperature distribution evaluation method according to the present invention. Note that any device having the heating region 40A for heating the heat treatment target can be the measurement target of the present invention.

The heating device 40 includes a heating chamber 41 in which the heating region 40A for heating a heat treatment target is formed, a stage 42 on which the heat treatment target can be installed in the heating region 40A, a heater 43 that forms the heating region 40A, a vacuum forming valve 44 that exhausts the inside of the heating chamber 41, and an inert gas injection valve 45 that introduces an inert gas into the heating chamber 41.

The heating device 40 is configured to be able to heat a heat treatment target in a temperature range of 1000° C. to 2300° C. In addition, the heat treatment apparatus is configured to be able to heat the heat treatment target in a temperature range of preferably 1600° C. or higher, more preferably 1800° C. or higher, and still more preferably 2000° C. or higher.

The temperature gradient is formed in the heating chamber 41 (heating region 40A) during the heat treatment. The temperature gradient is formed, for example, by escaping minute heat from a contact portion between the stage 42 and the heating chamber 41. In this case, the heat treatment target can be heated by providing the temperature gradient so that the temperature decreases from the upper direction toward the lower direction of the heating chamber 41.

In addition, a configuration in which the temperature gradient is formed by the heater 43 may be adopted. For example, the heater 43 may be configured so that many heaters are arranged on the upper side. In addition, the heater 43 may be configured so that the width increases toward the upper side. Alternatively, the heater 43 may be configured to be able to increase the power supplied toward the upper side.

Furthermore, the temperature gradient may be provided so that the temperature decreases from the lower direction toward the upper direction.

The measurement point P can be set at any position in the heating region 40A.

FIG. 2(a) is a side view in a case where a plurality of measurement points P are set in the horizontal direction of the heating region 40A. FIG. 2(b) is a plan view in a case where the plurality of measurement points P are set in the horizontal direction of the heating region 40A.

In addition, it is also possible to set the plurality of measurement points P in the height direction of the heating region 40A.

<Substrate Disposition Process S20>

The substrate disposition process S20 is a process of disposing the semiconductor substrate 10 and the release and reception body 20 along the plurality of measurement points P set in the measurement point setting process S10.

Figure 3:
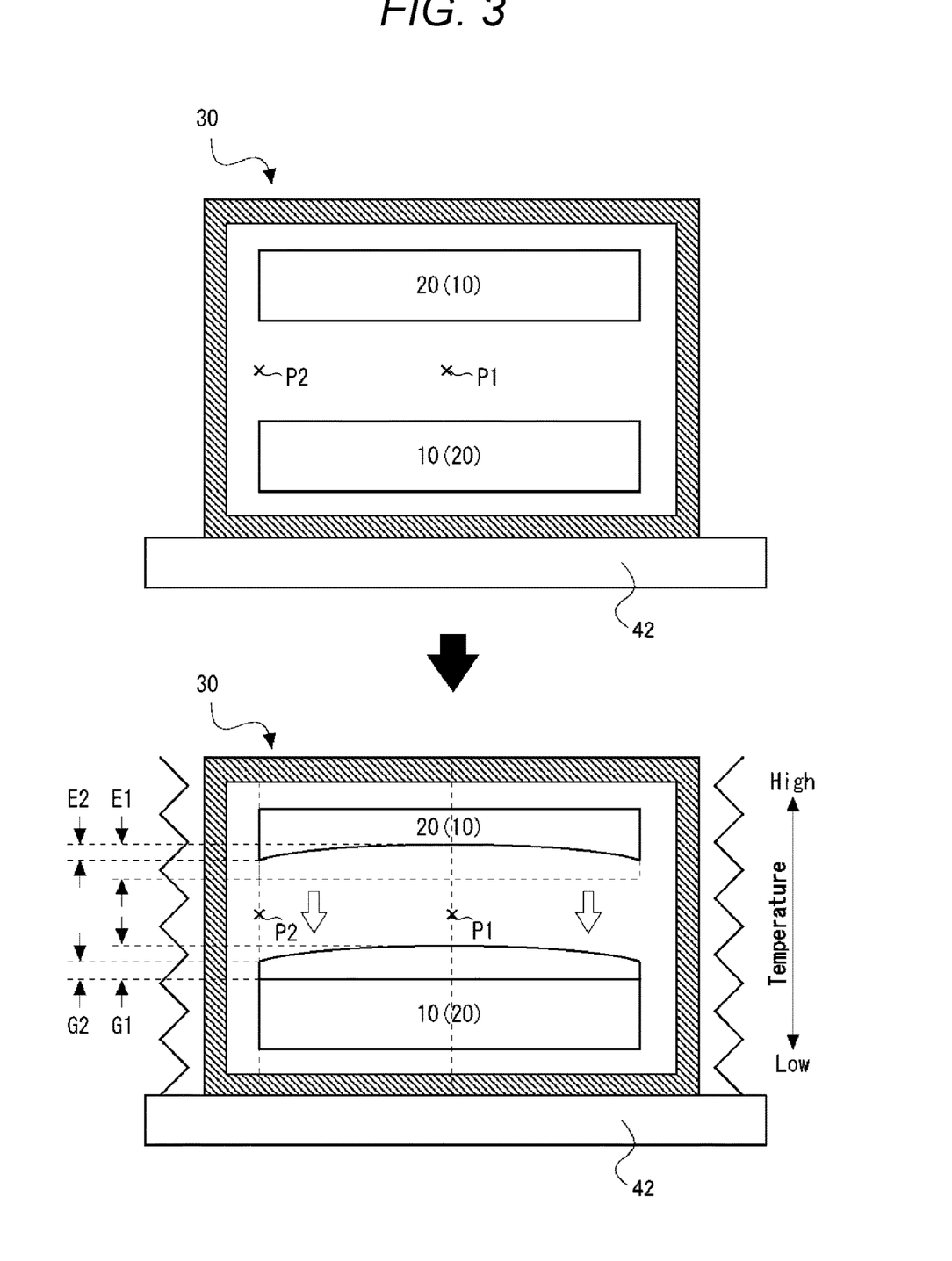
FIG. 3 is a schematic view for describing a substrate disposition process to a change amount comparison process of the temperature distribution evaluation method according to the present invention.

FIG. 3 illustrates a state in which the semiconductor substrate 10 and the release and reception body 20 are arranged along the measurement points P1 and P2 in FIG. 2. Specifically, the semiconductor substrate 10 and the release and reception body 20 are disposed so as to be arranged along the direction in which the plurality of measurement points P are arranged, and the plurality of measurement points P and the surface of the semiconductor substrate 10 whose substrate thickness changes is disposed so as to be substantially parallel. Therefore, the measurement point P may be on the surface of the semiconductor substrate 10, or the measurement point P may be at a position away from the surface of the semiconductor substrate 10 by a certain distance.

In the semiconductor substrate 10, a semiconductor wafer formed by slicing an ingot prepared by a sublimation method or the like into a disk shape, or a single crystal substrate obtained by processing a single crystal into a thin plate shape can be used. Note that as the crystal polymorph of the single crystal, any polytype can be adopted.

In addition, examples of the material of the semiconductor substrate 10 include an SiC substrate, a GaN substrate, and an AlN substrate.

The release and reception body 20 is made of a material that transports the raw material to the semiconductor substrate 10 during heating, and is preferably made of the same material as semiconductor substrate 10. For example, in a case where the semiconductor substrate 10 is made of single crystal SiC, the release and reception body 20 is made of single crystal SiC or polycrystalline SiC. That is, the semiconductor substrate 10 may be adopted as the release and reception body 20.

In FIG. 3, with respect to the temperature gradient formed by the heating device 40, a mode is illustrated in which the semiconductor substrate 10 is grown by disposing the semiconductor substrate 10 on the low temperature side and disposing the release and reception body 20, and vice versa. That is, a mode may be adopted in which the semiconductor substrate 10 is etched by disposing the semiconductor substrate 10 on the high temperature side and the release and reception body 20 on the low temperature side with respect to the temperature gradient formed by the heating device 40.

In addition, it is preferable that the semiconductor substrate 10 and the release and reception body 20 are disposed in the storage container 30 forming the quasi-closed space. Note that the "quasi-closed space" in the present specification refers to a space in which the inside of the container can be evacuated but at least a part of the vapor generated in the container can be confined.

By receiving or transmitting the raw material (atom) in such a quasi-closed space, it is possible to more accurately measure a substrate thickness change amount A by suppressing the raw material from being exhausted. That is, in the storage container 30, it is preferable to form, in the container, an atmosphere containing elements constituting the semiconductor substrate 10 during the heating.

The storage container 30 is preferably made of a high melting point material having a melting point equal to or higher than the melting point of the material of the semiconductor substrate 10. Specifically, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, and $TiB_2$ which are borides, or SiC, GaN, and AlN which are materials similar to the semiconductor substrate 10 can be exemplified.

In a case where the storage container 30 is made of a material similar to that of the semiconductor substrate 10, an atmosphere of elements constituting the semiconductor substrate 10 can be formed in the container during the heating. In addition, a vapor source that supplies vapor of an element similar to that of the semiconductor substrate 10 may be disposed in the storage container 30.

In addition, it can be selected whether or not to use the storage container 30 depending on the configuration of the heating device 40. That is, when the heating region 40A of the heating device 40 is configured to be able to form the quasi-closed space, the semiconductor substrate 10 and the release and reception body 20 may be disposed without using the storage container 30. On the other hand, when the heating region 40A of the heating device 40 is an open system, it is preferable to use the storage container 30.

<Heating Process S30>

As illustrated in FIG. 3, the heating process S30 is a process of heating so as to form the temperature gradient between the semiconductor substrate 10 and the release and reception body 20 disposed in the substrate disposition process S20. In this way, by providing the temperature gradient between the semiconductor substrate 10 and the release and reception body 20 and performing the heating, atoms are transported using the temperature gradient as a driving force, and the semiconductor substrate 10 is etched or grown.

In this case, in a case where the temperature varies depending on the measurement point P, the semiconductor substrate 10 is grown or etched so as to reflect the temperature of each measurement point P. That is, in the high temperature portion in the heating region 40A, the etching amount E and the growth amount G of the semiconductor substrate 10 and the release and reception body 20 increase, and in the low temperature portion in the heating region 40A, the etching amount E and the growth amount G decrease.

In FIG. 3, the etching amount E1 and the growth amount G1 at the measurement point P1, which is a high temperature portion, increase, and the etching amount E2 and the growth amount G2 at the measurement point P2, which is a low temperature portion, decrease.

<Change Amount Measuring Process S40>

The change amount measurement process S40 is a process of measuring the substrate thickness change amount A of the semiconductor substrate 10 changed in the heating process S30. The substrate thickness change amount A can be obtained from the substrate thickness before the heating process S30 and the substrate thickness after the heating process S30. Note that the substrate thickness change amount A includes the etching amount E and the growth amount G.

As the measurement means, a measurement method including an electron microscope, a laser microscope, a probe microscope, and the like can be adopted without particular limitation. For example, the semiconductor substrate 10 is broken at the measurement point P after the heating process S30, and the fracture surface is observed with an electron microscope, so the growth amount G at the measurement point P can be measured.

In addition, growth layers having different contrasts in an electron microscope image are formed in advance on the semiconductor substrate 10, and the etching amount E and the growth amount G can be measured on the basis of the amount of the growth layer observed after the heating process S30.

<Change Amount Comparison Process S50>

The change amount comparison process S50 is a process of comparing the substrate thickness change amount A at each measurement point P measured in the change amount measurement step S40 for each measurement point P. For example, when comparing the substrate thickness change amount A (growth amount G) at the measurement point P1 and the measurement point P2 in FIG. 3, the growth amount G1 at the measurement point P1 is greater than the growth amount G2 at the measurement point P2. Further, when the substrate thickness change amount A (etching amount E) is compared using the semiconductor substrate 10 as the release and reception body 20, the etching amount E1 at the measurement point P1 is smaller than the etching amount E2 at the measurement point P2.

From the above, it can be seen that the temperature is different between the measurement point P1 and the measurement point P2 in the heating region 40A. In addition, it can be seen that the temperature at the measurement point P2 is lower than that at the measurement point P1.

On the other hand, when the substrate thickness change amount A (the etching amount E and/or the growth amount G) is substantially the same at the measurement points P, it can be seen that the same heating environment is provided at the measurement point P.

That is, according to the temperature distribution measuring method of the present invention, by measuring the substrate thickness change amount A at the measurement point P with respect to the heating region 40A of the heating device 40, it is possible to grasp the soaking range of the heating region 40A under a high temperature environment of 1600° C. or higher or 1800° C. or higher. As a result, it is possible to contribute to the temperature management in the semiconductor manufacturing process and to improve the manufacturing yield of the semiconductor device.

<<Temperature Distribution Evaluation Device>>

Next, a mode of a temperature evaluation device that performs the temperature distribution evaluation will be described in detail with reference to the first embodiment and the second embodiment.

First Embodiment

Hereinafter, a temperature distribution evaluation device according to a first embodiment of the present invention will be described in detail. Note that, in this embodiment, the same reference numerals are given to constituent elements that are basically the same as those in the above temperature distribution evaluation method, and the description thereof will be simplified.

Figure 4:
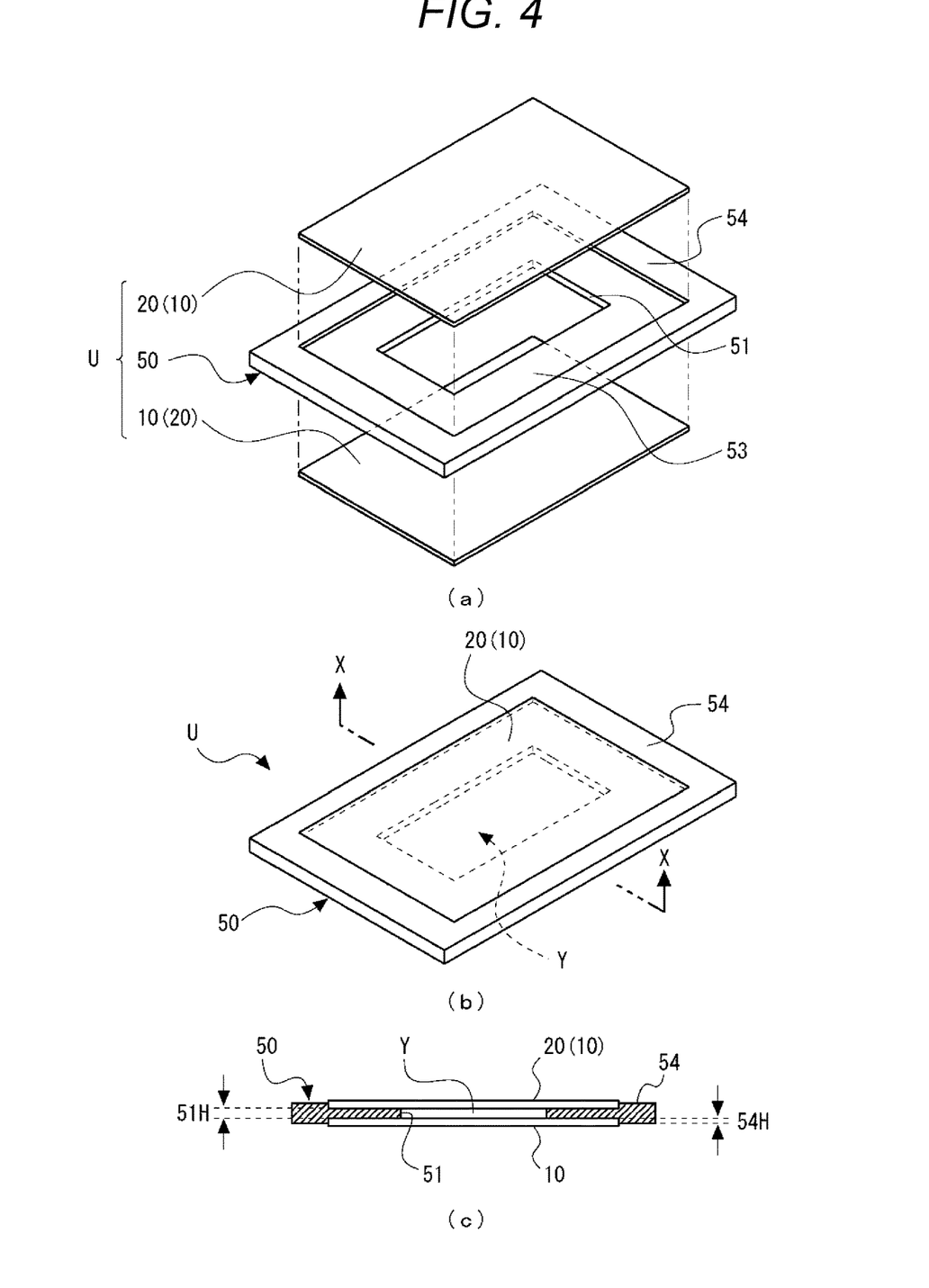
FIG. 4 is an explanatory diagram of a temperature distribution measurement device according to a first embodiment.

The temperature distribution evaluation device according to the first embodiment includes a temperature distribution evaluation unit U disposed in the heating region 40A of the heating device 40. As illustrated in FIG. 4, the temperature distribution evaluation unit U includes a semiconductor substrate 10, a release and reception body 20 that faces the semiconductor substrate and transports a raw material by heating, and an installation tool 50 that installs the semiconductor substrate 10 and the release and reception body 20 so as to face each other.

In addition, when the heating region 40A of the heating device 40 is not the quasi-closed space, the heating device further includes the storage container 30 that stores the temperature distribution evaluation unit U.

The storage container 30 is a fitting container including an upper container 31 and a lower container 32 that can be fitted to each other. A minute gap 33 is formed in a fitting portion between the upper container 31 and the lower container 32 so that the inside of the storage container 30 can be exhausted (evacuated). As a result, the quasi-closed space can be formed in the storage container 30.

In addition, the storage container 30 is configured to be able to form a material environment capable of forming an atmosphere containing Si vapor during the heating. For example, the upper container 31 and the lower container 32 made of TaC, which are high melting point materials, are adopted, and a configuration in which a tantalum silicide layer is formed inside the container is adopted. With this configuration, Si vapor is generated from a tantalum silicide layer during the heating, and the storage container 30 can be made into an Si vapor pressure space. In addition, the storage container 30 made of polycrystalline SiC that supplies Si vapor and C vapor during the heating may be adopted.

In the present embodiment, a description will be given in detail by adopting a single crystal SiC substrate for the semiconductor substrate 10 and the release and reception body 20, but an AlN substrate or a GaN substrate may be adopted depending on a temperature region to be measured.

Examples of the semiconductor substrate 10 and the release and reception body 20 include an SiC wafer obtained by slicing an ingot fabricated by a sublimation method or the like into a disk shape, or SiC substrates obtained by processing an SiC single crystal into a thin plate shape. Note that as a crystal polymorph of the SiC single crystal, any polytype can be adopted.

Further, a single crystal substrate or a polycrystalline substrate can be exemplified. Further, the single crystal substrate may have an epitaxial growth layer on a surface thereof. Further, the epitaxial growth layer may be made of a material different from the material of the single crystal substrate.

The installation tool 50 includes a support portion 51 that forms a gap H51 between the semiconductor substrate 10 and the release and reception body 20, a first abutting surface 52 on which the semiconductor substrate 10 abuts, a second abutting surface 53 on which the release and reception body 20 abut, and a frame portion 54 (positioning means) provided along edges of the semiconductor substrate 10 and the release and reception body 20.

The gap H51 formed by the support portion 51 is preferably 100 mm or less, more preferably 50 mm or less, more preferably 20 mm or less, more preferably 10 mm or less, still more preferably 7 mm or less, still more preferably 5 mm or less, still more preferably 3.5 mm or less, still more preferably 3 mm or less, and still more preferably 2.7 mm or less. The gap H201 of the installation tool is preferably greater than or equal to 0.7 mm, more preferably greater than or equal to 1.0 mm, more preferably greater than or equal to 1.2 mm, still more preferably greater than or equal to 1.5 mm, and still more preferably greater than or equal to 1.7 mm. The gap H51 is a distance between substrates, and is a distance between the transport source and the transport destination related to the material transport described later.

The first abutting surface 52 and the second abutting surface 53 are formed so as to be able to abut on the outer edge portions of the semiconductor substrate 10 and the release and reception body 20, and are set to the size in which the quasi-closed space is formed in the gap H51.

Therefore, the first abutting surface 52 and the second abutting surface 53 have a configuration in which a through hole is provided inside.

The frame portion 54 is provided along the edges (outer shapes) of the semiconductor substrate 10 and/or the release and reception body 20, and is a positioning means that suppresses the deviation of the semiconductor substrate 10 or the release and reception body 20 from the first abutting surface and the second abutting surface. In FIG. 4, an example in which the frame portion 54 is provided on the entire peripheral portion of the installation tool 50 is illustrated, but the positioning means may be formed by providing a protruding portion or the like on a part thereof. In addition, the form in which the positioning means is formed on one surface of the installation tool 50 may be adopted.

In addition, a height 54H of the frame portion 54 is preferably equal to or less than the thickness of the semiconductor substrate 10 or the release and reception body 20. In this way, by setting the height 54H to be equal to or less than the thickness of the semiconductor substrate 10 or the release and reception body 20, the height can be brought into close contact with the semiconductor substrate 10 or the release and reception body 20 disposed under the installation tool 50.

In addition, a length of the installation tool 50 may have a length of 4.0 mm and a width of 8.0 mm, for example. In addition, the width of the through hole in the installation tool 50 is, for example, 2.0 mm.

The material of the installation tool 50 preferably has the same constituent elements as those of the semiconductor substrate 10 and the release and reception body 20.

Next, the process of measuring the temperature distribution using the temperature distribution measuring device according to the first embodiment will be described in detail with reference to FIGS. 5 and 6.

The temperature distribution evaluation method according to the first embodiment includes: a measurement point setting process S10 (not illustrated) of setting a plurality of measurement points P in the heating region 40A; a substrate disposition process S20 of disposing, at a position corresponding to the measurement point P, the temperature distribution evaluation unit U including two semiconductor substrates 10 and the installation tool 50 for installing the semiconductor substrates 10 so as to face each other; a heating process S30 of heating the temperature distribution evaluation unit U subsequent to the substrate disposition process S20; a change amount measurement step S40 of measuring substrate thickness change amounts A (etching amount E and/or growth amount G) of the semiconductor substrate 10 subsequent to the heating process S30; and a change amount comparison process S50 of comparing the substrate thickness change amounts A at the plurality of measurement points P.

Figure 6:
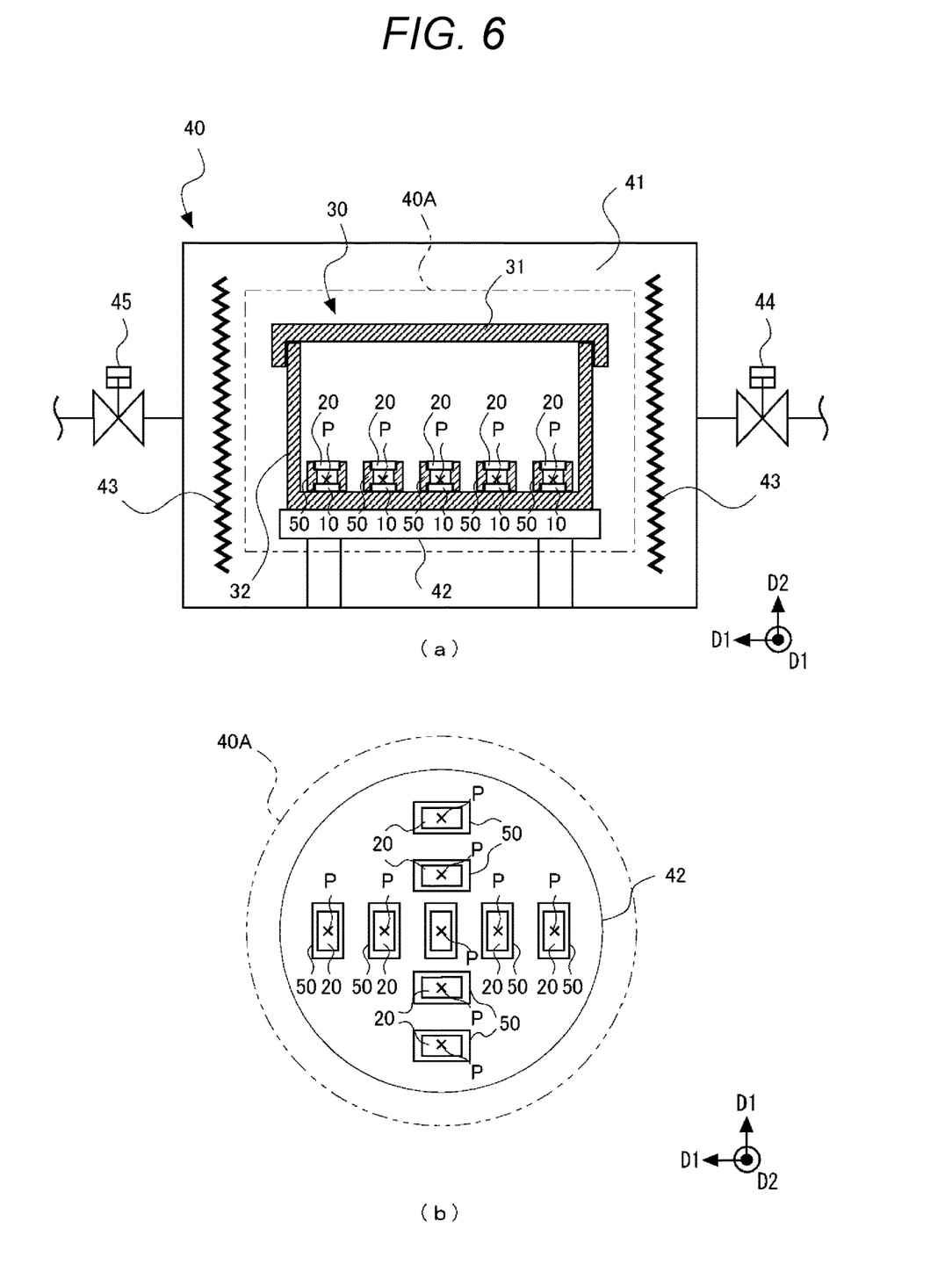
FIG. 6 is an explanatory diagram of the temperature distribution measurement device according to the first embodiment.

In the measurement point setting process S10 according to the first embodiment, as illustrated in FIG. 6, the plurality of measurement points P are set in a horizontal direction D1 of the heating region 40A. In addition, the measurement points P may be arranged in a vertical direction D2 in the heating region 40A, or may be set to be arranged in the horizontal direction D1 and/or the vertical direction D2.

It can be understood that the heating process S30 according to the first embodiment includes a raw material transport process of transporting a raw material from one semiconductor substrate 10 to the other semiconductor substrate 10.

Figure 5:
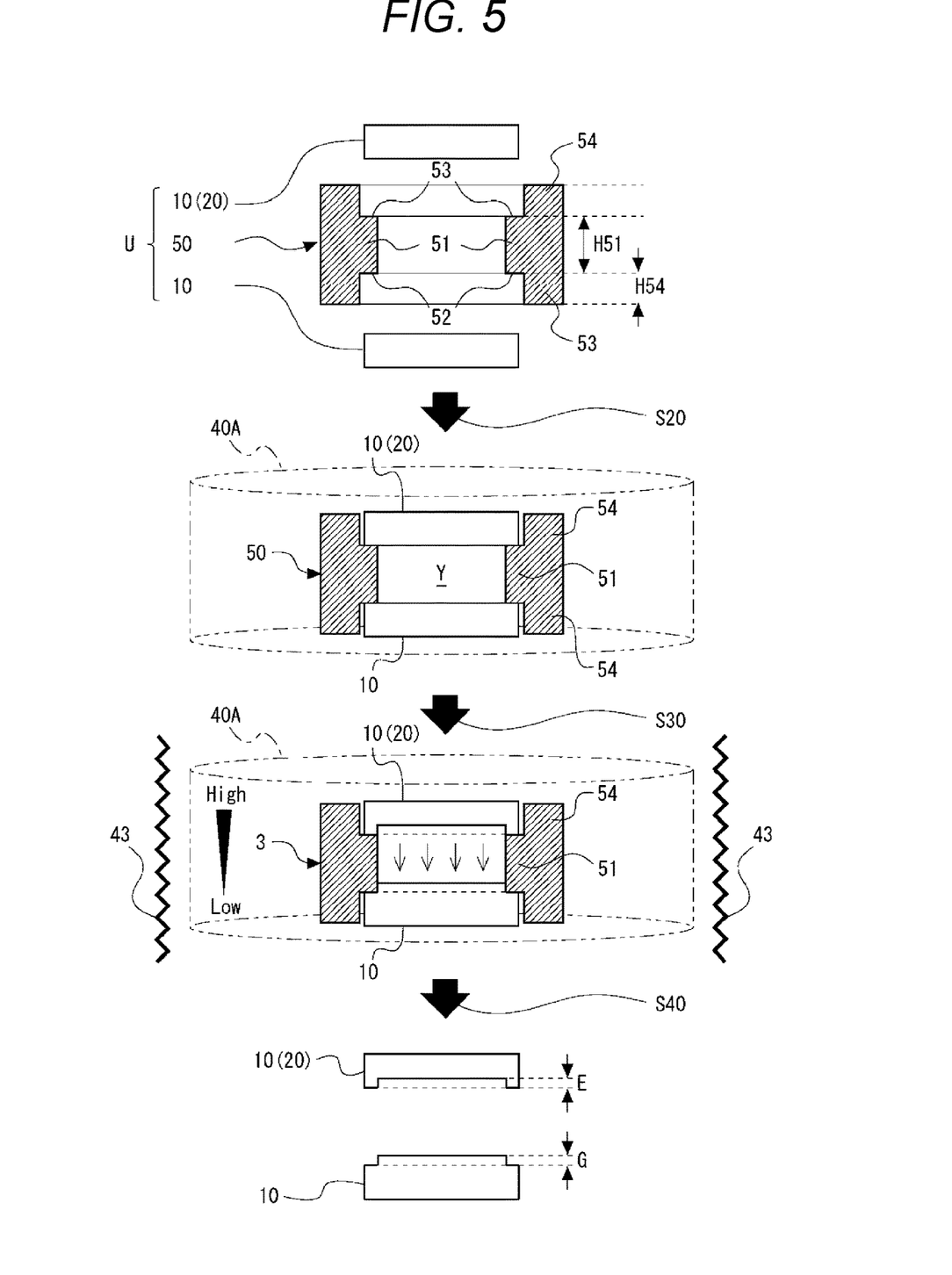
FIG. 5 is an explanatory diagram of the temperature distribution measurement device according to the first embodiment.

As illustrated in FIG. 5, when the temperature distribution evaluation unit U is heated in the first embodiment, the sublimation gas is transported from the semiconductor substrate 10 to a raw material transport space Y. Note that in the present specification, the sublimation gas and the raw material are synonymous.

It can be understood that the generation and transport of the sublimation gas proceed by the continuation of the following 1) to 5).

1)

2)

3)

4)

5)

Description of 1): Si atoms (Si (v)) are preferentially desorbed by heating one semiconductor substrate 10 (SiC (s)) (Si atom sublimation process).

Descriptions of 2) and 3): C(C(s)) remaining on the surface of the semiconductor substrate 10 due to the desorption of Si atoms (Si(v)) reacts with Si vapor (Si(v)) in the raw material transport space Y to become $Si_2C$, $SiC_2$, or the like and sublimate into the raw material transport space Y (C atom sublimation process).

Description of 4) and 5): Sublimed $Si_2C$, $SiC_2$, or the like reaches and diffuses into the terrace of the surface of the other semiconductor substrate 10 due to the temperature gradient, and reaches the step, and reaches a step, so the growth layer is grown and formed by taking over the polymorph of the surface of the semiconductor substrate 10 (step flow growth).

The heating process includes an Si atom sublimation process of thermally sublimating Si atoms from the semiconductor substrate 10, and a C atom sublimation process of sublimating C atoms remaining on the semiconductor substrate 10 by bonding the C atoms to the Si atoms in the raw material transport space Y.

The heating process includes an etching process of etching the surface of the semiconductor substrate as a transport source of the raw material based on the Si atom sublimation process and the C atom sublimation process.

Further, the raw material transport process includes an epitaxial growth layer forming process of forming an epitaxial growth layer based on the step flow growth on the surface of the semiconductor substrate as the transport destination of the raw material.

In the heating process, it can be understood that $Si_2C$, $SiC_2$, or the like diffused in the raw material transport space Y is supersaturated and coagulates at the transport destination. It can be understood that the formation of the growth layer in the first embodiment 1 is based on a physical vapor transport.

It can be understood that a driving force of the raw material transport in the first embodiment is, for example, a temperature difference between the semiconductor substrates 10 due to the temperature gradient formed in the temperature distribution evaluation unit U.

A chemical potential difference due to the crystal structures of the surfaces of the two semiconductor substrates facing each other can also be understood as the driving force of the raw material transport. For example, in the temperature distribution evaluation unit U including the single crystal substrate surface and the polycrystalline substrate surface facing each other, it can be understood that the vapor pressure difference due to the crystal structure of the substrate surface can be the driving force of the raw material transport.

In the change amount measurement process S40, the substrate thickness change amount A (etching amount E and/or growth amount G) of the semiconductor substrate 10 is measured. In this case, the substrate thickness change amount A is measured by acquiring an irregularity shape or the like by cross-section observation or surface observation. It may correspond to each of different points on the surface of the same semiconductor substrate 10. In particular, in the present embodiment, the substrate thickness change at the portion where the semiconductor substrate 10 and the installation tool 50 abut on each other is suppressed, so the substrate thickness change amount A can be easily measured using a laser microscope or the like.

In the change amount comparison process S50 in the first embodiment, the temperature distribution in the heating region 40A is evaluated based on the substrate thickness change amount A obtained in the change amount measurement step S40.

In the evaluation process in the first embodiment, as an example, the temperature distribution in the heating region 40A is evaluated based on the substrate thickness change amount A, the partial pressure difference, the surface density, and the desorption coefficient corresponding to the surface of the semiconductor substrate 10, and the molecular weight and the gas constant of the sublimation gas. The partial pressure difference is determined based on the vapor pressure corresponding to each of the surfaces of the semiconductor substrate 10 and the temperature difference.

According to the temperature distribution evaluation device according to the present embodiment, the etching amount E and the growth amount G can be easily measured by making the semiconductor substrate 10 and the release and reception body 20 so as to face each other using the installation tool 50. That is, the etching or growth are suppressed on the first abutting surface 52 (or the second abutting surface 53) on which the semiconductor substrate (or the release and reception body 20) and the installation tool 50 abut. Therefore, a step corresponding to the growth amount G and the etching amount E is formed on the surface after the heating process S30. By measuring the height of the step, the substrate thickness change amount A can be easily obtained.

Further, according to the temperature distribution evaluation device of the present embodiment, the substrate thickness change amount A of the measurement point P set in the heating region 40A can be obtained with a small area of the semiconductor substrate 10 by disposing the plurality of temperature distribution evaluation units U in the heating region 40A.

Second Embodiment

Hereinafter, a temperature distribution evaluation device according to a second embodiment of the present invention will be described in detail. Note that, in the present embodiment, the same reference numerals are given to constituent elements that are basically the same as those in the above-described temperature distribution evaluation method and the configuration described in the first embodiment, and the description thereof will be simplified.

Figure 7:
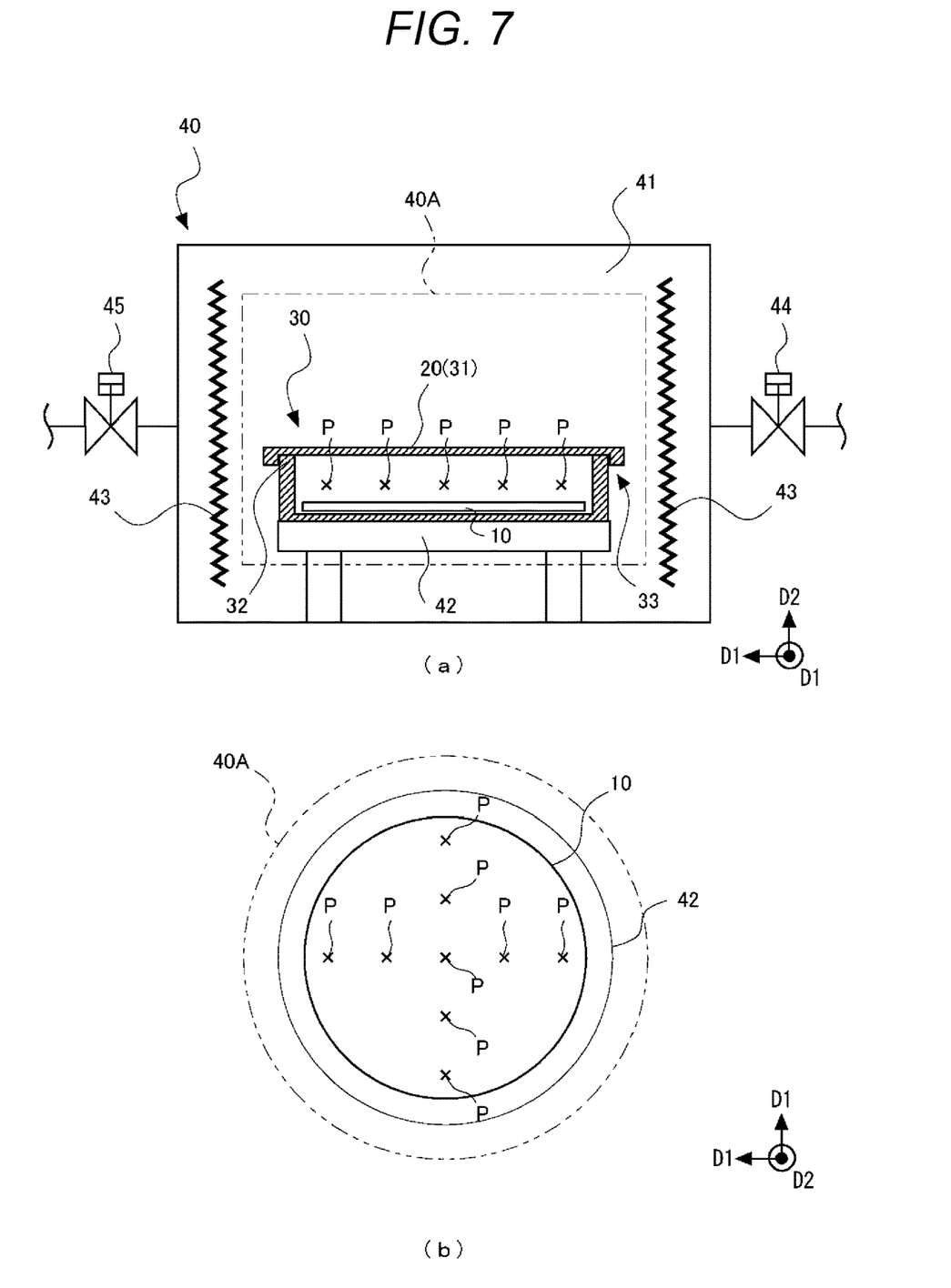
FIG. 7 is an explanatory diagram of a temperature distribution measurement device according to a second embodiment.

A temperature distribution evaluation device according to the second embodiment includes a semiconductor substrate 10 and a storage container 30 that stores the semiconductor substrate 10. In the storage container 30, at least a part of the container is constituted by a release and reception body 20.

The semiconductor substrate 10 is set to have an area extending over a plurality of measurement points P set in the heating region 40A. For example, wafers of 2 inches or more, 4 inches or more, 6 inches or more, and 8 inches or more can be exemplified.

The storage container 30 is made of, for example, polycrystalline SiC. In this way, the storage container 30 itself can include the semiconductor substrate 10 and the release and reception body 20 that transports a raw material.

In addition, in a case of adopting a configuration in which the semiconductor substrates 10 face each other using the installation tool 50 as in the first embodiment, the above-described high melting point material can be adopted as the material of the storage container 30.

In addition, although not illustrated, the container may be further disposed outside the storage container 30.

According to the temperature distribution evaluation device according to the second embodiment, the temperature distribution in the heating region 40A can be evaluated over a wider range by adopting the semiconductor substrate 10 having an area extending over the plurality of measurement points P. In particular, since a threshold value of a soaking range in the heating region 40A can be understood, this contributes to temperature management in the semiconductor manufacturing process and contributes to improvement in manufacturing yield of semiconductor device.

Reference Example

Figure 8:
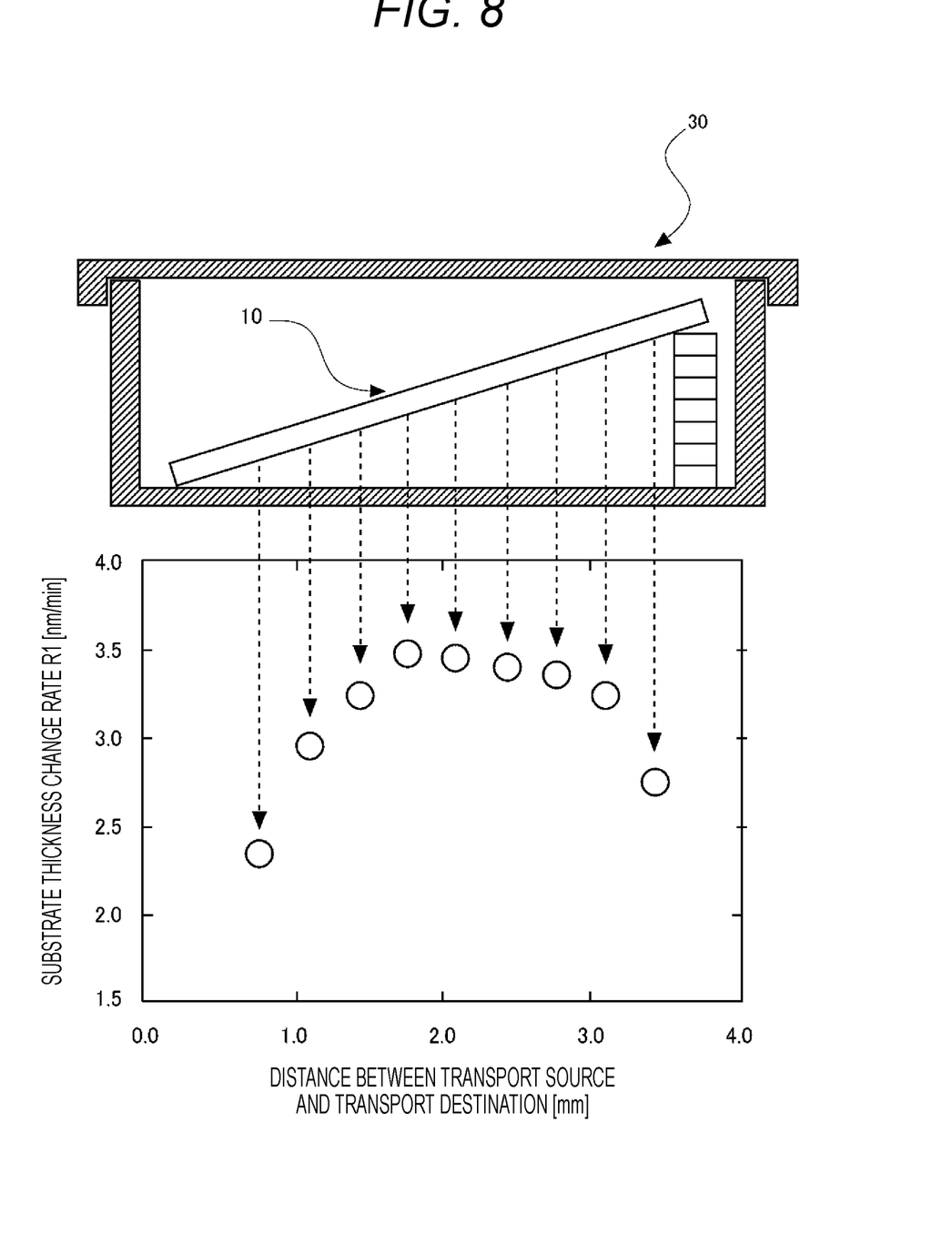
FIG. 8 is a graph and the like illustrating distance dependence of a transport source and a transport destination in a substrate thickness change rate in a reference example.

As illustrated in FIG. 8, a substrate thickness change rate R1 has distance dependence of a transport source and a transport destination.

In a raw material transport in FIG. 8, a transport source and a transport destination are a semiconductor substrate 10 and a storage container 30, respectively. A material of the storage container 30 is SiC polycrystal. In this case, an inclination is imparted by inserting a spacer into one end portion of the semiconductor substrate 10, and the distance dependence of the transport source and the transport destination is understood. It can be understood that a substrate thickness change rate R1 increases when the distance between the transport source and the transport destination is in a range of 1.7 to 2.7 mm.

Examples

Evaluation of a temperature distribution (examples) was attempted by the following method. Note that conditions of the following examples will be described below.

<Measurement Point Setting Process S10>

In measurement point setting process S10, measurement points P1 to P7 are set for a heating region 40A having a diameter of 15 cm. Specifically, the measurement point P1 is set at a position of −7.5 cm from an approximate center of the heating region 40A, the measurement point P2 is set at a position of −5.0 cm from an approximate center of the heating region 40A, the measurement point P4 is set at a position of −2.5 cm from an approximate center of the heating region 40A, the measurement point P4 is set at a position of 0.0 cm from the approximate center of the heating region 40A, the measurement point P5 is set at a position of 2.5 cm from an approximate center of the heating region 40A, the measurement point P6 is set at a position of 5.0 cm from an approximate center of the heating region 40A, and the measurement point P7 is set at a position of 7.5 cm from an approximate center of the heating region 40A.

Note that the measurement points P1 to P7 are arranged in a straight line.

<Substrate Disposition Process S20>

In the substrate disposition process S20, the temperature distribution evaluation unit U in which the following semiconductor substrate 10 faces by the installation tool 50 is disposed at positions corresponding to the measurement points P1 to P7. Note that the temperature distribution evaluation unit U was stored in the storage container 30.

[Semiconductor Substrate 10]

Substrate material: 4H—SiC single crystal

Substrate size: 12 mm (horizontal width), 4 mm (vertical width), and 0.3 mm (thickness)

Off direction and Off angle: <11-20> direction 4° off

[Installation Tool 50]

Member material: SiC polycrystal

Member size: 0.3 mm (installation tool gap), 0.2 mm (installation tool frame width), 8 mm×3 mm (installation tool frame length)

[Storage Container 30]

Container material: TaC

Tantalum silicide layer:

Container size: 160 mm (diameter), 60 mm (height)

<Heating Process S30>

The semiconductor substrate 10 disposed under the conditions of the substrate disposition process S20 was heated under the following heating conditions.

[Heating Condition]

Heating temperature: 1800° C.

Temperature gradient: 1° C./mm Heating time: 1 h

<Change Amount Measuring Process S40>

Figure 9:
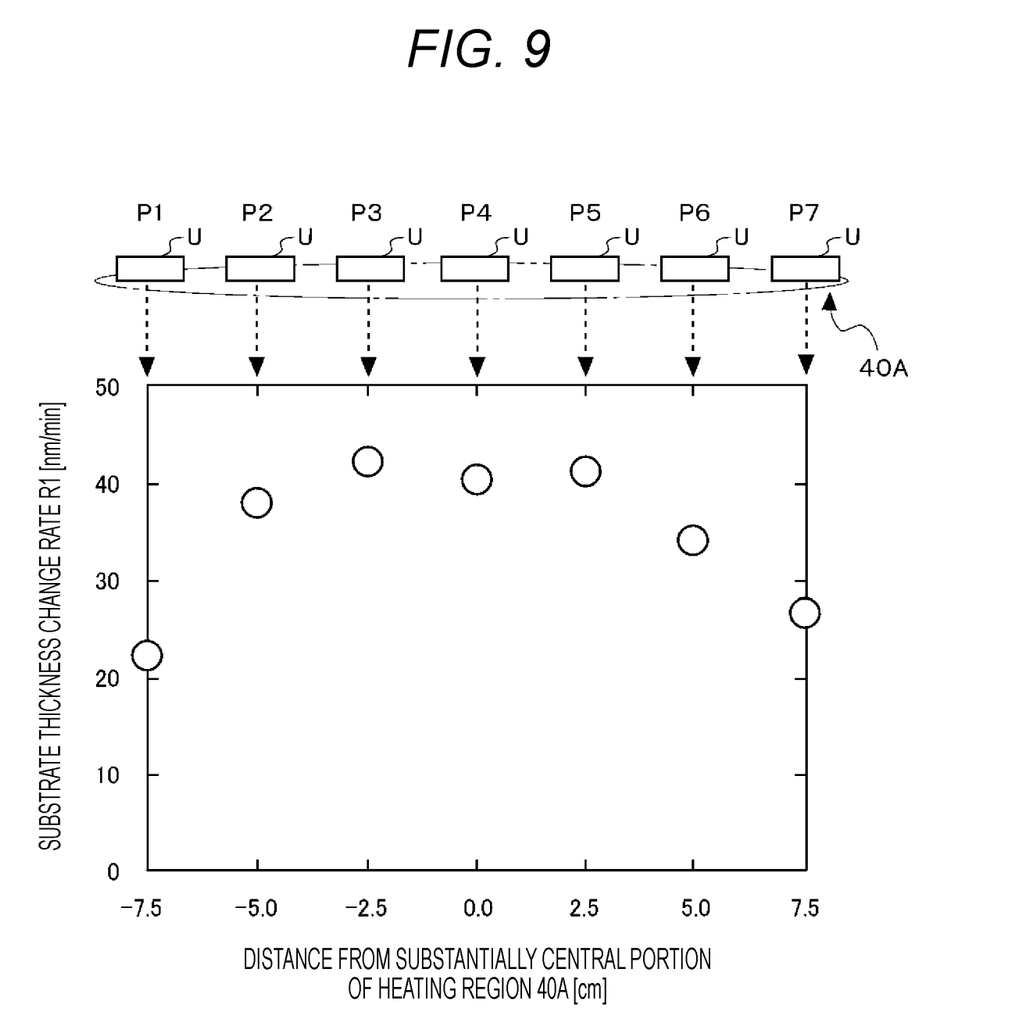
FIG. 9 is a graph and the like illustrating position dependence of a substrate thickness change rate in Examples.

FIG. 9 illustrates an explanatory diagram in which the substrate thickness change amount A at the measurement points P1 to P7 is measured and converted into the substrate thickness change rate R1. The substrate thickness change amount A was measured by a laser microscope. Note that the etching amount E of the semiconductor substrate 10 disposed on the high temperature side and the growth amount G of the semiconductor substrate 10 disposed on the low temperature side had substantially the same value.

<Change Amount Comparison Process S50>

As illustrated in FIG. 9, the substrate thickness change rate R1 measured by the temperature evaluator 1 after heating depends on the distance from the substantially central portion of the heating region 40A. In addition, as can be seen from FIG. 9, in the heating region 40A, the range from the measurement point P3 to the measurement point P5 can be evaluated as a soaking region. Also in the range from the measurement point P2 to the measurement point P6, it can be evaluated that the temperature range does not adversely affect the semiconductor manufacturing process.

Note that the position dependence of the substrate thickness change rate R1 in the present embodiment can be understood to be, for example, a temperature decrease at a substantially end portion of the heating region 40A due to generation of a heat flow through a contact point between a support column supporting the storage container 30 and the storage container 30.

According to the present invention, it is possible to suitably evaluate the temperature distribution in the heating region while maintaining the quasi-closed space in the storage container. As a result, it is possible to achieve temperature distribution evaluation in a region sealed with a material that does not transmit infrared rays or the like.

Further, according to the present invention, the raw material transport using the partial pressure difference between the substrate surfaces as the driving force is performed in a space where the distance between the semiconductor substrates is uniform. As a result, in-plane variations in the etching rate and the growth rate of the epitaxial growth layer can be suppressed, and the temperature distribution evaluation based on the substrate thickness change amount can be suitably performed.

REFERENCE SIGNS LIST

10 Semiconductor substrate
20 Release and reception body
30 Storage container
40 Heating device
40A Heating region
50 Installation tool
D1 Horizontal direction
D2 Vertical direction

The invention claimed is:

1. A temperature distribution evaluation method for evaluating a temperature distribution in a heating region included in a heating device, the temperature distribution evaluation method comprising:
   heating a semiconductor substrate and a release and reception body, which transports a raw material to the semiconductor substrate, in the heating region; and
   evaluating the temperature distribution in the heating region based on a substrate thickness change amount of the semiconductor substrate;
   wherein the raw material is a sublimation gas generated from at least one of the semiconductor substrate or the release and reception body.

2. The temperature distribution evaluation method according to claim 1, wherein
   the semiconductor substrate and the release and reception body are disposed so as to face each other, and are heated so that a temperature gradient is formed between the semiconductor substrate and the release and reception body.

3. The temperature distribution evaluation method according to claim 1, wherein
   the substrate thickness change amount is an amount obtained by changing the temperature gradient formed in the heating region as a driving force.

4. The temperature distribution evaluation method according to claim 1, further comprising:
   a measurement point setting process of setting a plurality of measurement points in the heating region;
   a substrate disposition process of disposing the semiconductor substrate and the release and reception body at positions corresponding to the measurement points;
   a change amount measurement process of measuring the substrate thickness change amounts of the semiconductor substrates corresponding to the measurement points; and
   a change amount comparison process of comparing the plurality of substrate thickness change amounts.

5. The temperature distribution evaluation method according to claim 4, wherein
   the measurement point setting process set the plurality of measurement points in the horizontal direction of the heating region.

6. The temperature distribution evaluation method according to claim 4, wherein
   in the measurement point setting process, the plurality of measurement points are set in a height direction of the heating region.

7. The temperature distribution evaluation method according to claim 4, wherein in the substrate disposition process, the plurality of semiconductor substrates are disposed along the measurement point.

8. The temperature distribution evaluation method according to claim 1, wherein
the substrate thickness change amount is an etching amount or a growth amount.

9. The temperature distribution evaluation method according to claim 1, wherein
the semiconductor substrate and the release and reception body are selected from any one of SiC, GaN, and AlN materials.

10. A temperature distribution evaluation device, comprising:
a temperature distribution evaluation unit that is disposed in a heating region included in a heating device;
wherein the temperature distribution evaluation unit includes a first semiconductor substrate and a release and reception body that faces the first semiconductor substrate and transports a raw material by heating;
wherein the release and reception body is a second semiconductor substrate, or at least a part of a storage container that stores the first semiconductor substrate.

11. The temperature distribution evaluation device according to claim 10, wherein
the temperature distribution evaluation unit includes an installation tool that installs the first semiconductor substrate and the release and reception body so as to face each other.

12. The temperature distribution evaluation device according to claim 11, wherein
the installation tool is provided with a first abutting surface on which the first semiconductor substrate abuts and a second abutting surface on which the release and reception body abuts.

13. The temperature distribution evaluation device according to claim 11, wherein
the installation tool includes a positioning unit that positions at least one of the first semiconductor substrate or the release and reception body.

14. The temperature distribution evaluation device according to claim 13, wherein
the positioning means is a frame portion provided along an edge of at least one of the first semiconductor substrate or the release and reception body.

15. The temperature distribution evaluation device according to claim 10, wherein the temperature distribution evaluation unit is provided in plurality.

16. The temperature distribution evaluation device according to claim 10, further comprising:
a storage container that stores the temperature distribution evaluation unit,
wherein the storage container forms, in the container, an atmosphere containing an element constituting the first semiconductor substrate during heating.

17. The temperature distribution evaluation device according to claim 10, further comprising:
the storage container that stores the first semiconductor substrate,
wherein a part of the storage container is constituted by the release and reception body.

18. The temperature distribution evaluation device according to claim 10, wherein
the first semiconductor substrate and the release and reception body are selected from any one of SiC, GaN, and AlN materials.

19. A soaking range evaluation method, comprising:
heating, in a heating region of a heating device, a semiconductor substrate and a release and reception body that transports a raw material to the semiconductor substrate at a plurality of measurement points in the heating region; and evaluating a soaking range of the heating region based on a substrate thickness change amount of the semiconductor substrate;
wherein the raw material is a sublimation gas generated from at least one of the semiconductor substrate or the release and reception body.

20. The soaking range evaluation method according to claim 19, wherein
the semiconductor substrate and the release and reception body are disposed so as to face each other, and are heated so that a temperature gradient is formed between the semiconductor substrate and the release and reception body.

21. The soaking range evaluation method according to claim 19, further comprising:
a measurement point setting process of setting a plurality of measurement points in the heating region;
a substrate disposition process of disposing the semiconductor substrate and the release and reception body at positions corresponding to the measurement points;
a heating process of heating the semiconductor substrate and the release and reception body in the heating region to change a substrate thickness of the semiconductor substrate;
a change amount measuring process of measuring a substrate thickness change amount of the semiconductor substrate corresponding to the measurement point; and
a change amount comparison process of comparing substrate thickness change amounts at a plurality of the measurement points.

22. The soaking range evaluation method according to claim 19, wherein the heating temperature of the semiconductor substrate and the release and reception body is 1600° C. or higher.

23. The soaking range evaluation method according to claim 19, wherein the heating temperature of the semiconductor substrate and the release and reception body is 1800° C. or higher.

* * * * *